United States Patent [19]

Kirsch

[11] 4,408,136
[45] Oct. 4, 1983

[54] MOS BOOTSTRAPPED BUFFER FOR VOLTAGE LEVEL CONVERSION WITH FAST OUTPUT RISE TIME

[75] Inventor: Howard C. Kirsch, Colorado Springs, Colo.

[73] Assignee: Mostek Corporation, Carrollton, Tex.

[21] Appl. No.: 328,375

[22] Filed: Dec. 7, 1981

[51] Int. Cl.³ ............... H03K 19/017; H03K 19/096
[52] U.S. Cl. .................................. 307/475; 307/363; 307/453; 307/578
[58] Field of Search .............. 307/443, 448, 453, 475, 307/481, 482, 350, 354, 362, 363, 246, 572, 575, 577, 578, 583, 584, 264, 270

[56] References Cited

U.S. PATENT DOCUMENTS

| | | | |
|---|---|---|---|
| 3,716,723 | 2/1973 | Heuner et al. | 307/481 X |
| 3,845,324 | 10/1974 | Feucht | 307/448 |
| 3,859,545 | 1/1975 | Clemons et al. | 307/246 X |
| 3,889,135 | 6/1975 | Nomiya et al. | 307/482 |
| 3,988,617 | 10/1976 | Price | 307/482 X |
| 4,000,412 | 12/1976 | Rosenthal et al. | 307/284 X |
| 4,042,838 | 8/1977 | Street et al. | 307/482 X |
| 4,045,691 | 8/1977 | Asano | 307/475 X |

*Primary Examiner*—Larry N. Anagnos
*Assistant Examiner*—David R. Hudspeth

[57] ABSTRACT

A buffer circuit (10) receives a TTL input signal at an input node (12) and produces an MOS logic signal at an output node (38). A capacitor (22) is precharged by a precharge signal (PC) to a high voltage state and a control node (32) is precharged to a high voltage state. An input transistor (14) receives a reference voltage which is a function of the levels of the TTL input. When the TTL input is high the transistor (14) is nonconductive thereby maintaining the charge at the control node (32) to render conductive a pull-down transistor (36) which drives the output signal at the output node (38) to a low state. When the TTL input signal goes to a low voltage state the input transistor (14) is rendered conductive by discharging a terminal of the capacitor (22). A second terminal of the capacitor (22) is driven to a lower voltage state to render conductive a discharge transistor (30) which connects the control node (32) to the node (24) connected to capacitor (22). This serves to discharge the control node (32) thereby turning off the pull-down transistor (36) and permitting a pull-up transistor (40) to drive the output node (38) to a high voltage state. The buffer circuit (10) functions as an inverter and provides a rapid transition of the output signal in response to a transition of the input signal.

10 Claims, 1 Drawing Figure

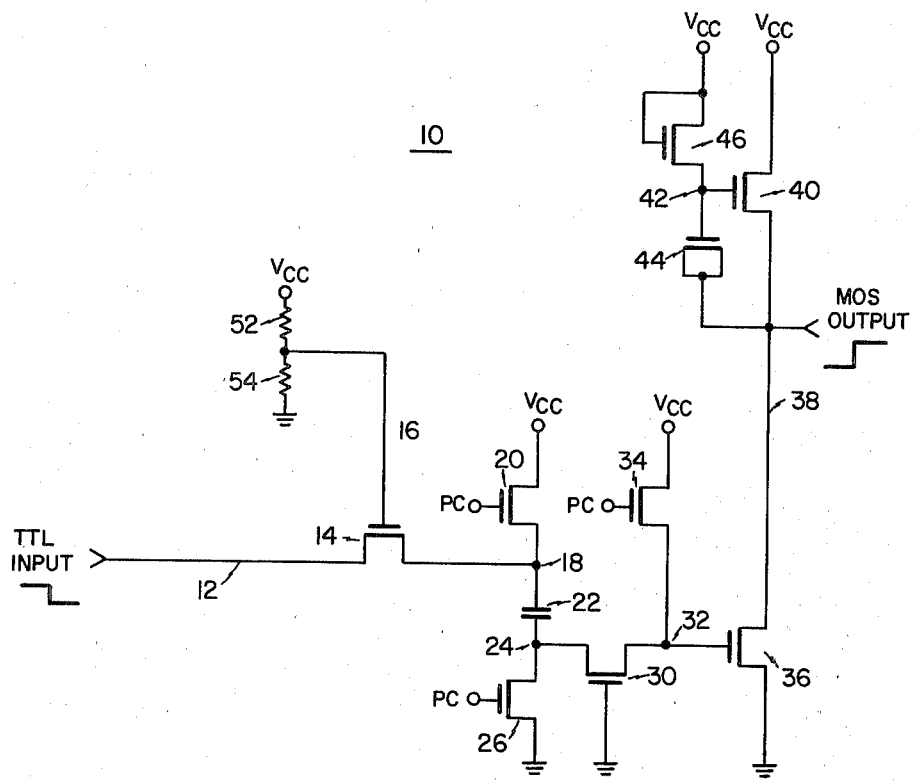

MOS BOOTSTRAPPED BUFFER FOR VOLTAGE LEVEL CONVERSION WITH FAST OUTPUT RISE TIME

TECHNICAL FIELD

The present invention pertains to a buffer circuit and more particularly to such a circuit for converting TTL (Transistor-Transistor Logic) voltage levels to MOS (Metal Oxide Semiconductor) logic voltage levels.

BACKGROUND ART

In circuit design it is frequently necessary to interface TTL signal levels with MOS circuits which typically have a different set of signal levels. For example, typical TTL logic levels can be 0.8 and 2.4 volts while MOS logic levels are approximately 0.0 and 5.0 volts. A number of different types of interface circuits have been used including conventional amplifiers and Schmidt trigger circuits. The low voltage differentials for TTL circuits present a problem since the MOS circuits require a much greater voltage differential between the logic levels. A primary limitation of conventional interface circuits is the slow transition speed of the MOS logic signal in response to a change in the logic level of the TTL signal.

In view of the speed limitations inherent in conventional interface circuits between TTL and MOS circuits, there exists a need for an interface buffer circuit for receiving a TTL logic signal and producing an MOS logic signal with a rapid response rate.

SUMMARY OF THE INVENTION

A selected embodiment of the present invention is a buffer circuit which includes a capacitor and circuit means for precharging the capacitor to a first state. An input transistor circuit is connected to receive an input signal for driving the capacitor from the first state to a second state when the input signal transitions from a first voltage level to a second voltage level. Circuitry is provided for precharging a control node. Further circuit means connected to the capacitor and to the control node are provided for discharging the control node when the capacitor is driven from the first state to the second state. An output transistor means is connected to the control node for driving an output node to a third voltage level when the control node is precharged and for driving the output node to a fourth voltage level when the control node is discharged.

BRIEF DESCRIPTION OF DRAWINGS

For a more complete understanding of the present invention and the advantages thereof, reference is now made to the following Detailed Description taken in conjunction with the accompanying Drawing in which the FIGURE is a schematic illustration of a circuit embodying the present invention.

DETAILED DESCRIPTION

Referring now to the FIGURE there is illustrated a buffer circuit 10 which incorporates the present invention. A TTL input signal is provided to an input node 12. Typical voltage levels for the binary logic state to the input signal are 2.4 volts and 0.8 volts. A transistor 14 has a gate terminal thereof connected to a node 16 for receiving a reference signal. The source and drain terminals of transistor 14 are connected between the input node 12 and a node 18.

A precharge transistor 20 has the gate terminal thereof connected to receive a precharge (PC) signal and the drain terminal thereof connected to a power terminal $V_{cc}$. The source terminal of transistor 20 is connected to node 18. Upon receipt of the PC signal the transistor 20 is rendered conductive to precharge node 18.

A capacitor 22 has a first terminal thereof connected to node 18 and a second terminal thereof connected to a node 24. A precharge transistor 26 has the drain terminal thereof connected to node 24, the gate terminal thereof connected to receive the PC signal and the source terminal thereof connected to a second power terminal, ground. The transistor 26 serves to precharge node 24 to a ground state.

A discharge transistor 30 has the gate terminal thereof connected to ground, and the source and drain terminals thereof connected between the node 24 and a control node 32. The transistor 26 is fabricated to have a higher threshold voltage than transistor 30 to prevent current flow through transistor 26.

A precharge transistor 34 has the gate terminal thereof connected to receive the PC signal, the drain terminal thereof connected to the power terminal $V_{cc}$ and the source terminal thereof connected to node 32. The transistor 34 serves to precharge the node 32 to a high voltage state.

A pull-down transistor 36 has the gate terminal thereof connected to the control node 32, the source terminal thereof connected to ground and the drain terminal thereof connected to an output node 38.

A pull-up transistor 40 has the drain terminal thereof connected to $V_{cc}$, the source terminal thereof connected to node 38 and the gate terminal thereof connected to a node 42. A transistor 44 has the gate terminal thereof connector to node 42 and the source and drain terminals thereof connected to the output node 38. A transistor 46 has the gate and drain terminals thereof connected to $V_{cc}$ and the source terminal thereof connected to node 42.

A voltage divider network comprises resistors 52 and 54 which are serially connected between the power terminals $V_{cc}$ and ground. The voltage divider network produces the reference signal at the junction of resistors 52 and 54. The reference signal is provided through node 16 to the gate terminal of transistor 14.

Operation of the buffer circuit 10 is now described in reference to the FIGURE. Circuit 10 functions to receive TTL logic level signals and to product output signals compatible with MOS circuits. TTL signals, as noted above, have a typical voltage differential of approximately 1.6 volts while MOS logic signals have a typical voltage differential of 5.0 volts. Thus the circuit 10 must operate to produce bi-level output signals in response to relatively small changes in the input signal. A primary objective of the circuit 10 is to produce the output signals as rapidly as possible in response to a state change of the input signal.

The voltage divider resistors 52 and 54 produce at node 16 the reference signal which is provided to the input transistor 14. The reference signal voltage is defined as a function of the voltage levels of the TTL input signal. The reference signal is essentially equal to the threshold voltage of transistor 14 plus one half of the sum of the TTL logic levels. A typical threshold voltage for transistor 14 is 1.0 volt. Therefore, for the described example, the reference voltage is $1.0+\frac{1}{2}(0.8+2.4)=2.6$ volts. The reference signal at node 16 can be produced by any number of methods to carry out the present invention.

The reference signal at the gate of transistor 14 causes transistor 14 to be nonconductive when the TTL input signal is at the high voltage state but to be conductive when the TTL signal is at the low voltage state.

Transistor 20 serves to precharge node 18 by pulling it up to the voltage $V_{cc}$ minus the threshold voltage of transistor 20. The node 32 is likewise pulled by transistor 34 to the voltage $V_{cc}$ less the threshold voltage of transistor 34. The node 24 is pulled to the ground voltage state by transistor 26. The precharging of nodes 18 and 24 serves to charge the capacitor 22 to a first state which is essentially the voltage $V_{cc}$ minus the threshold of transistor 20.

When node 32 is charged to a high voltage state transistor 36 is turned on thereby pulling the output node 38 essentially to ground. Thus when the TTL input signal at node 12 is in a high voltage state the transistor 14 is turned off and node 32 remains charged thereby holding the output node 38 at a low voltage state.

When the input signal at node 12 goes to the 0.8 volt state transistor 14 will be rendered conductive which will in turn discharge node 18 through transistor 14 into the input node 12. As the voltage at node 18 falls the voltage at node 24 will likewise be driven to a lower voltage level. The voltage at node 24 is driven sufficiently negative to turn on transistor 30 to discharge node 32 into node 24. The capacitor 22 is fabricated to have essentially three to four times the capacitance of node 32 thereby permitting node 32 to be pulled to essentially a ground voltage state. When node 32 goes to a low voltage transistor 36 is turned off therby isolating node 38 from ground. Transistor 40 serves to pull node 38 upward toward the voltage $V_{cc}$. As node 38 rises the voltage will be bootstrapped upward at node 42 thereby turning on transistor 40 even harder. This boot strap operation serves to boost the voltage at the output node 38 to the full supply voltage $V_{cc}$. It can therefore be seen that when the TTL input level transitions from 2.4 volts to 0.8 volts, a negative transition, the MOS output signal at node 38 transistions from near 0 volts to approximately 5.0 volts, a positive transistion. The circuit 10 thus functions as an inverter and performs as a negative going edge detector.

A typical prior art buffer circuit is a Schmidt trigger which includes a pull-down transistors corresponding to transistor 36. In such an application the transistor 36 must be fabricated as a pair of relatively large devices each having a width of, for example, 350 microns. Transistors of this size have substantial input capacitance which must be charged each time the transistors are turned on or off. The charging of these transistors significantly slows down the transition speed of the prior art buffer circuits. In contrast the transistor 36 of the present invention can be fabricated to have a width of approximately 30-35 microns. This results in substantially less capacitance which in turn leads to a much more rapid transistion speed for the output signal at node 38. The circuit 10 of the present invention further has the advantage of substantially less capacitive load on the TTL input than prior art buffer circuits.

In summary, the present invention comprises a buffer circuit for interfacing TTL signals with an MOS circuit while providing an extremely fast transition rate.

I claim:
1. A buffer circuit, comprising:
a capacitor;
means for precharging said capacitor to a first state;
input transistor means connected to receive an input signal for driving said capacitor from said first state to a second state when said input signal transistions from a first voltage level to a second voltage level;
a control node;
means for precharging said control node;
means connected to said capacitor and said control node for discharging said control node when said capacitor is driven from said first state to said second state; and
output transistor means connected to said control node for driving an output node to a third voltage level when said control node is precharged and for driving said output node to a fourth voltage level when said control node is discharged.

2. The buffer circuit recited in claim 1 wherein said input transistor means comprises means for generating a reference voltage and a transistor having the gate terminal thereof connected to receive said reference voltage, the drain terminal thereof connected to said capacitor and the source terminal thereof connected to receive said input signal wherein said transistor is nonconductive when said input signal is at said first voltage level and said transistor is conductive when said input signal is at said second voltage level.

3. The buffer circuit recited in claim 1 wherein said means for discharging comprises a transistor having the gate terminal thereof connected to a common node and the source and drain terminals thereof connected between said capacitor and said control node wherein said transistor is rendered conductive when said capacitor is driven from said first state to said second state thereby discharging said control node through said transistor.

4. The buffer circuit recited in claim 1 wherein said output transistor means comprises:
a first transistor having the gate terminal thereof connected to said control node, the drain terminal thereof connected to said output node and the source terminal thereof connected to a common node;
a second transistor having the drain terminal thereof connected to a power terminal and the source terminal thereof connected to said output node;
a third transistor having the gate terminal thereof connected to the gate terminal of said second transistor and the drain and source terminals thereof connected to said output node; and
a fourth transistor having the gate and drain terminals thereof connected to said power terminal and the source terminal thereof connected to the gate terminal of said second transistor.

5. A buffer circuit comprising:
an input transistor having the gate terminal thereof connected to receive a reference voltage, the source terminal thereof connected to receive an input signal having first and second voltage levels wherein said input transistor is nonconductive when the input signal is at said first voltage level and said input transistor is conductive when said input signal is at said second voltage level, the drain terminal thereof connected to a first node;
a capacitor having the terminals thereof connected between said first node and a second node;

a discharge transistor having the gate terminal thereof connected to a first power terminal and the source and drain terminals thereof connected between said second node and a third node;

a pull down transistor having the gate terminal thereof connected to said third node and the source and drain terminals thereof connected between said first power terminal and an output node;

pull up transistor means connected to said output node and to a second power terminal; and means for precharging said first and third nodes to a first voltage state and for precharging said second node to a second voltage state.

6. The buffer circuit recited in claim 5 wherein said first and second voltage levels are produced by a transistor-transistor logic (TTL) circuit.

7. A method for voltage level conversion, comprising the steps of:
precharging a capacitor;
precharging a control node;
discharging a first terminal of said capacitor in response to an input signal transitioning from a first voltage state to a second voltage state thereby driving a second terminal of said capacitor to a lower voltage state;

discharging said control node in response to said second terminal of said capacitor being driven to said lower voltage state;

driving an output node to a third voltage state in response to said control node being precharged; and driving said output node to a fourth voltage state in response to said control node being discharged.

8. The method recited in claim 7 wherein the step of discharging said capacitor comprises driving an input transistor connected to an input node, which receives said input signal and is connected to said first terminal, to a conductive state when said input signal transitions from said first voltage state to said second voltage state thereby discharging said capacitor through said first terminal to said input node.

9. The method recited in claim 7 wherein the step of discharging said control node comprises connecting said control node to the second terminal of said capacitor when said second terminal is driven to said lower voltage state to discharge said control node to said second terminal.

10. The method recited in claim 7 including the step of capacitively bootstrapping the driving of said output node to said third voltage state.

* * * * *